(12) United States Patent
Lee et al.

(10) Patent No.: US 7,868,422 B2
(45) Date of Patent: Jan. 11, 2011

(54) MOS DEVICE WITH A HIGH VOLTAGE ISOLATION STRUCTURE

(75) Inventors: Kuo-Ting Lee, Yonghe (TW); You-Kuo Wu, Sijhih (TW); Fu-Hsin Chen, Jhudong Township, Hsinchu County (TW); An-Ming Chiang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 603 days.

(21) Appl. No.: 11/280,888

(22) Filed: Nov. 16, 2005

(65) Prior Publication Data

US 2007/0108602 A1 May 17, 2007

(51) Int. Cl.
*H01L 29/06* (2006.01)
(52) U.S. Cl. .............................. 257/544; 257/E29.019
(58) Field of Classification Search ................. 257/500, 257/544, E29.018, E29.019
See application file for complete search history.

(56) References Cited

U.S. PATENT DOCUMENTS 5,618,688 A * 4/1997 Reuss et al. ................. 438/189
6,207,484 B1 * 3/2001 Kim et al. ................... 438/209
2002/0190309 A1  12/2002 Takahashi et al.
2004/0224472 A1  11/2004 Hebert ....................... 438/306

FOREIGN PATENT DOCUMENTS

| TW | 95103764 |   | 2/1995 |
| TW | 584967   | * | 4/2004 |
| TW | 584967 B |   | 4/2004 |
| WO | 98/28797 |   | 7/1998 |

* cited by examiner

*Primary Examiner*—Lynne A. Gurley
*Assistant Examiner*—Colleen A Matthews
(74) *Attorney, Agent, or Firm*—K&L Gates LLP

(57) ABSTRACT

The present invention discloses a semiconductor structure. A buried layer of a first polarity type is constructed on a semiconductor substrate. A first epitaxial layer of a second polarity type is formed on the buried layer. A second epitaxial layer of the second polarity type is formed on the buried layer. An isolation structure of the first polarity type is formed between the first and second epitaxial layers on the buried layer. A first well of the second polarity type is formed on the first epitaxial layer. A second well of the second polarity type is formed on the second epitaxial layer. A third well of the first polarity type is formed between the first and second wells, on the isolation structure. The isolation structure interfaces with the buried layer and the third well, thereby substantially blocking a leakage current path between the first and the second wells.

11 Claims, 4 Drawing Sheets

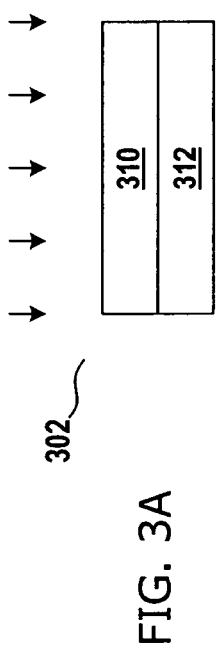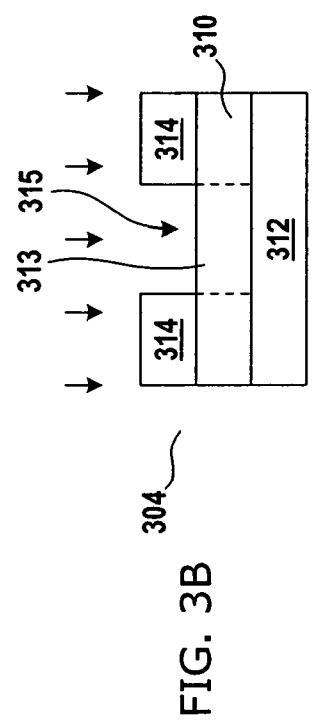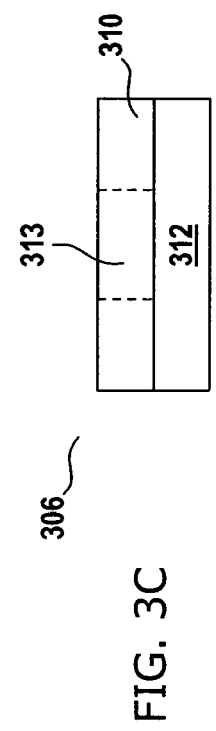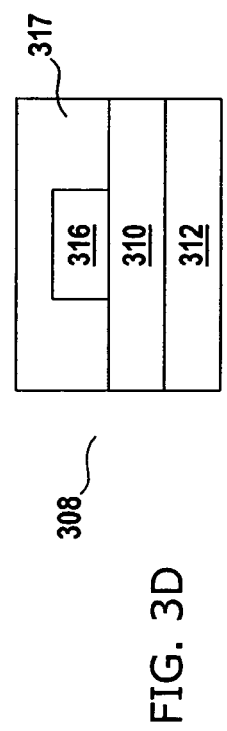
FIG. 3A
FIG. 3B
FIG. 3C
FIG. 3D

MOS DEVICE WITH A HIGH VOLTAGE ISOLATION STRUCTURE

BACKGROUND

The present invention relates generally to semiconductor processing technology, and more particularly to a metal-oxide-semiconductor (MOS) device with a high voltage isolation structure.

While recent development of MOS transistors has predominantly focused on very large scale integration (VLSI) technology, radio frequency (RF) MOS transistors are still commonly used for high power RF applications. The differences between the RF MOS transistors and VLSI devices are that the former have a larger channel length, greater junction depths and thicker gate oxides, as required to sustain the high power needed for most RF applications. Recent RF applications demand even more power. Most high power RF applications operate at supply voltages ranging from 20 to 50 volts.

There are two basic types of RF MOS transistors: the double-diffused MOS (DMOS) transistors, and the laterally-diffused MOS (LDMOS) transistors. While the two types of RF MOS transistors are different structurally with their unique behaviors, the transistors for both types are composed of a source, a gate, and a drain, with a substrate shorted to the source and a voltage applied on the gate for controlling the current flow between the drain and the source.

An LDMOS transistor is constructed in some occasions as a symmetric power MOS transistor. In a conventional method used for forming a high voltage isolation structure for a symmetric LDPMOS transistor, an N-type buried layer (NBL) is implemented between an epitaxial (EPI) layer and the substrate of the transistor. The EPI layer is required to be of a certain thickness for properly isolating the wells of the transistor from the substrate. In fact, as the operation voltage of the transistors becomes higher, the EPI layer needs to be thicker. However, the transistor may fail when the EPI layer is too thick. An improperly thick EPI layer can create a leakage current path between the source/drain regions of the transistor, which can cause the transistor to malfunction.

Desirable in the art of semiconductor processing technology are methods for forming a MOS transistor with a high voltage isolation structure for eliminating the current leakage issue induced by an improperly thick EPI layer.

SUMMARY

The present invention discloses a semiconductor structure. A buried layer of a first polarity type is constructed on a semiconductor substrate. A first epitaxial layer of a second polarity type is formed on the buried layer. A second epitaxial layer of the second polarity type is formed on the buried layer. An isolation structure of the first polarity type is formed between the first and second epitaxial layers on the buried layer. A first well of the second polarity type is formed on the first epitaxial layer. A second well of the second polarity type is formed on the second epitaxial layer. A third well of the first polarity type is formed between the first and second wells, on the isolation structure. The isolation structure interfaces with the buried layer and the third well, thereby substantially blocking a leakage current path between the first and the second wells.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 3A-3D illustrate cross sections of a semiconductor structure in various stages during a manufacturing process of a symmetric MOS transistor in accordance with one embodiment of the present invention.

DESCRIPTION

Figure 1:
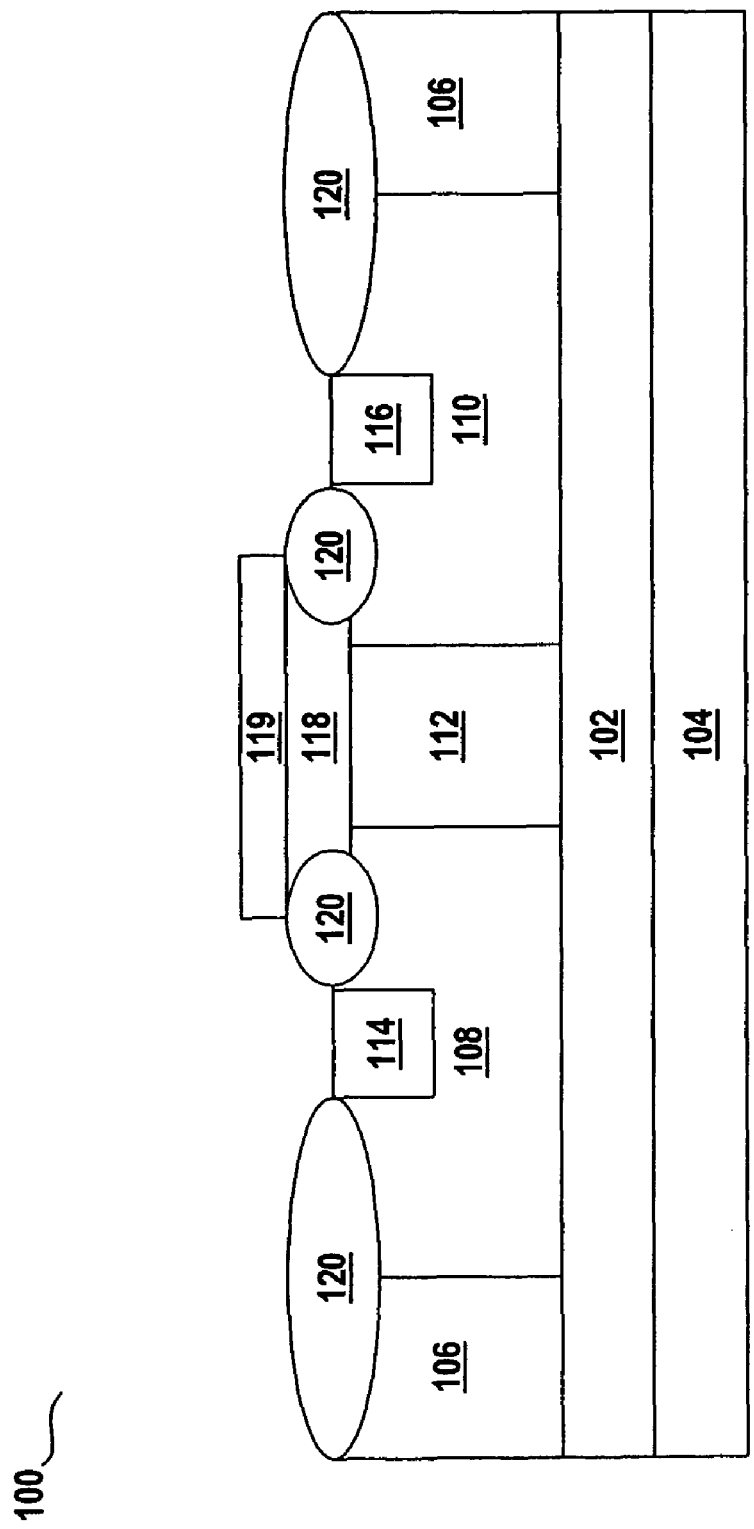
FIG. 1 illustrates a cross section of a conventional symmetric PMOS transistor.

FIG. 1 illustrates a cross section 100 of a conventional symmetric laterally-diffused PMOS (LDPMOS) transistor without an EPI layer. The LDPMOS transistor is constructed by first forming an NBL 102 on top of a P-type semiconductor substrate 104. An N-type isolation ring 106 is formed on the NBL 102. P-wells 108 and 110 are also formed within the isolation ring 106 with an N-well 112 interposed therebetween. A drain of the LDPMOS transistor (not shown in the figure) is connected to a P+ contact 114. A source of the LDPMOS transistor (not shown in the figure) is also connected to a P+ contact 116. A gate-oxide 118 is formed on the N-well 112 and partially on the P-wells 108 and 110. A gate structure 119 is formed on the gate-oxide 118. Oxides 120 are selectively formed on the surface of the LDPMOS transistor.

Since the LDPMOS transistor does not have an EPI layer, a punch-through may occur between the P-wells 108 and 110, and the substrate 104.

Figure 2:
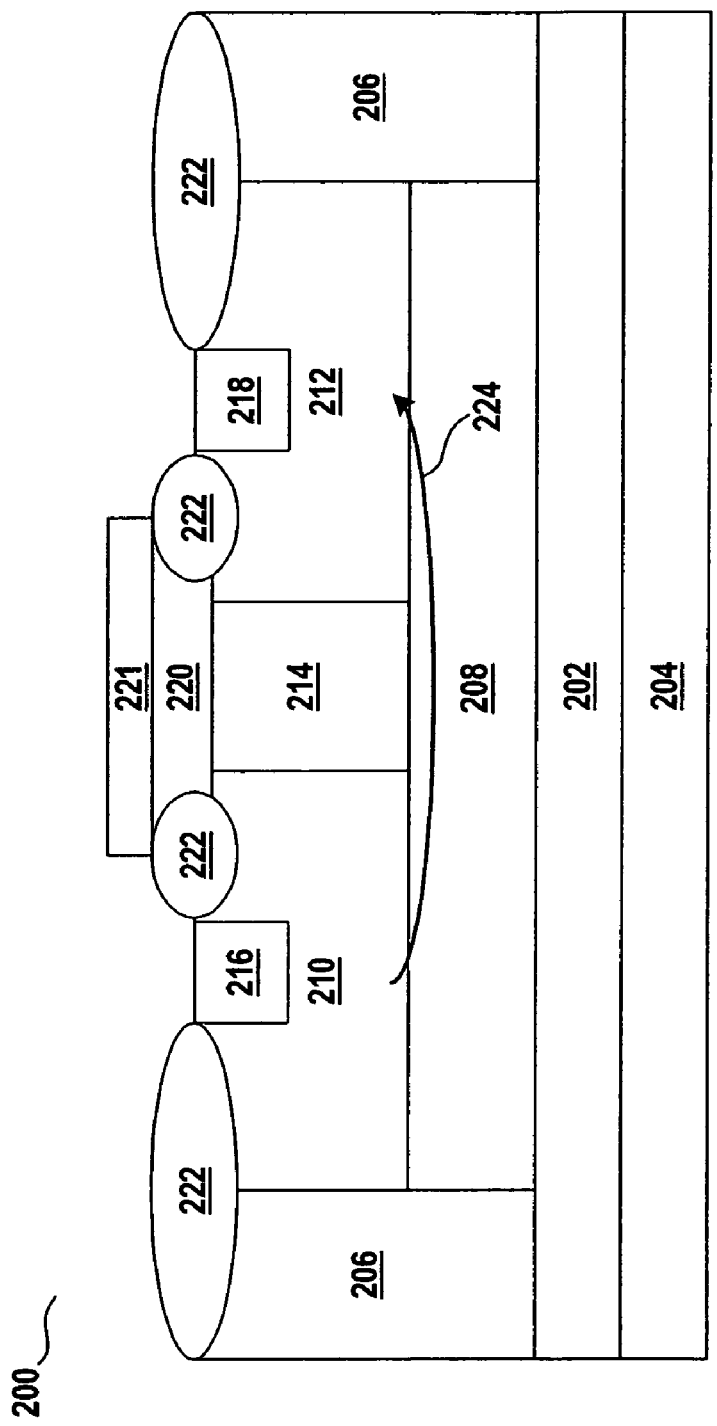
FIG. 2 illustrates a cross section of another conventional symmetric PMOS transistor.

FIG. 2 illustrates a cross-section 200 of a conventional symmetric LDPMOS transistor with an EPI layer. The LDPMOS transistor is constructed by first forming an NBL 202 on a P-type semiconductor substrate 204. An N-type isolation ring 206 is formed on the NBL 202. An EPI layer 208 is constructed within the isolation ring 206 and atop the NBL 202. P-wells 210 and 212 are also formed within the isolation ring 206 with an N-well 214 interposed therebetween. A drain of the LDPMOS transistor (not shown in the figure) is connected to a P+ contact 216. A source of the LDPMOS transistor (not shown in the figure) is also connected to a P+ contact 218. A gate-oxide 220 is formed on the N-well 214 and partially on the P-wells 210 and 212. A gate structure 221 is formed on the gate-oxide 220. Oxides 222 are selectively formed on the surface of the LDPMOS transistor.

While the EPI layer 208 helps to prevent a punch-through between the P-wells 210 and 212, and the substrate 204, it may cause the transistor to malfunction. This is particularly true when the transistor operates at a high voltage. For example, the EPI layer 208 needs to be thicker than 5 μm, if the transistor operates at a voltage level higher than 40 volts. The thick EPI layer 208 may allow a leakage current path 224 formed between the P-wells 210 and 212, which, in turn, may cause the transistor to malfunction.

FIGS. 3A-3D illustrate cross sections 302, 304, 306, and 308 of a semiconductor structure in various stages during a manufacturing process of a symmetric LDPMOS transistor in accordance with one embodiment of the present invention. In the cross section 302, an NBL 310 is formed by implanting N-type dopants into a P-type semiconductor substrate 312, which can be made of silicon materials. The depth of the NBL 310 depends on the energy of the implantation process. The dopant density of the NBL 310 is between about $1\times10^{17}$ cm$^{-3}$ and $2\times10^{18}$ cm$^{-3}$.

In the cross section 304, a photoresist layer 314 having an opening 315 is placed on the NBL 310. The opening 315 is used for defining a predetermined portion 313 of the NBL 310. Then, an ion implantation step is performed. The photoresist layer 314 shields its underlying portions of the NBL 310 from ion bombardment, while allowing dopants to be implanted into the predetermined portion 313 of the NBL 310 through the opening 315. The energy of the ion implantation can be adjusted so that a substantial number of the dopants will not penetrate through the NBL 310 into the substrate 312. The dosage of the ion implantation is adjusted to provide the predetermined portion 313 of the NBL 310 with a dopant density higher than that of the rest of the same portions. In this embodiment, the dopant density of the predetermined portion 313 is between about $1\times10^{17}$ cm$^{-3}$ and $2\times10^{18}$ cm$^{-3}$. The photoresist layer 314 is then removed to yield a semiconductor structure having a cross section 306 as shown in FIG. 3C.

Figure 3E:
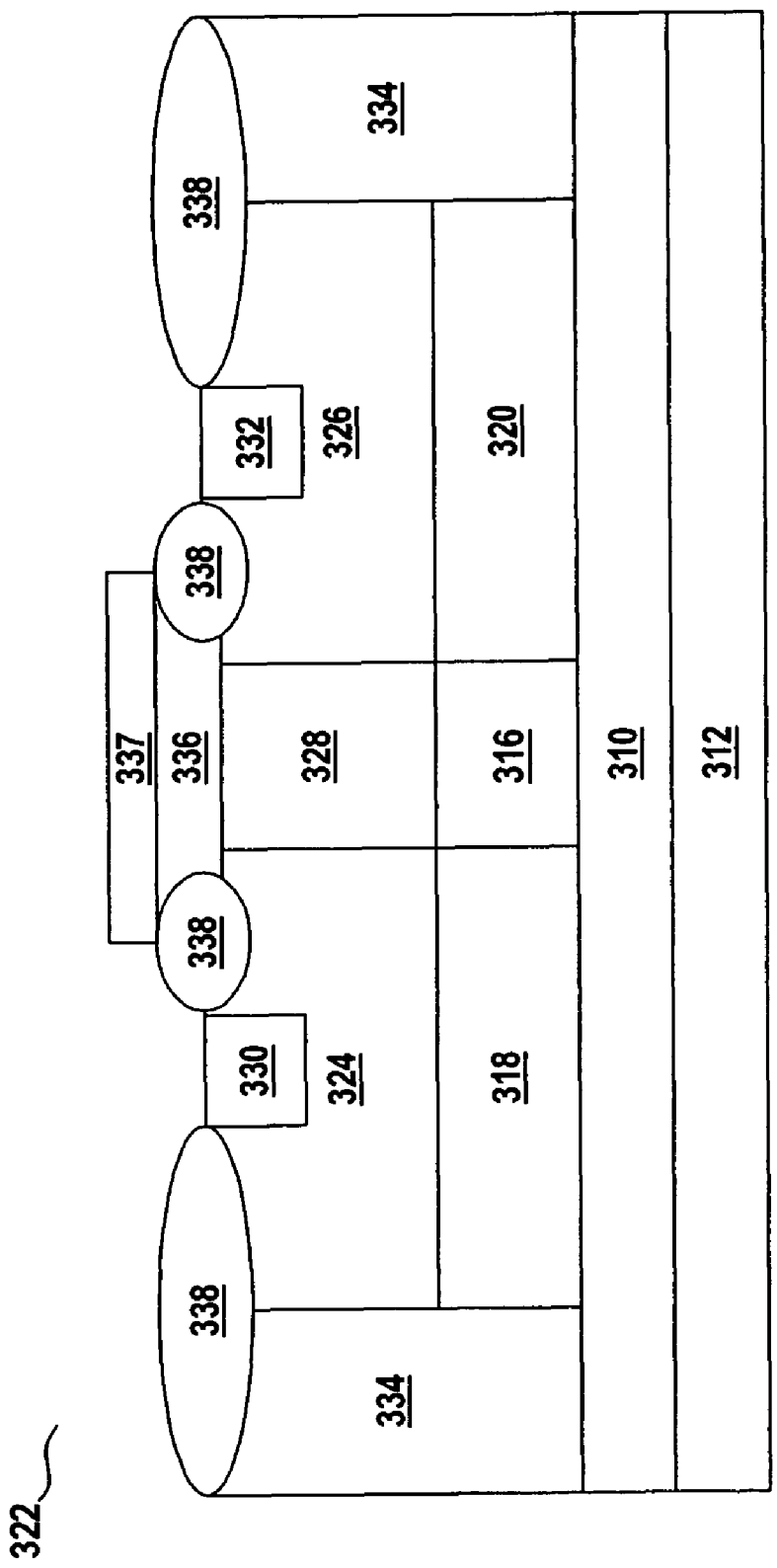
FIG. 3E illustrates a cross section of a symmetric MOS transistor with a high voltage isolation structure in accordance with the embodiment of the present invention.

A P-type EPI layer 317 is grown on the NBL 310 of the semiconductor structure as shown in FIG. 3C to yield a semiconductor structure having a cross section 308 as shown in FIG. 3D. The epitaxial growth is performed in a relatively high temperature environment. In this embodiment, the epitaxial growth is performed at a temperature ranging from 1000C and 1200C for SiHCl$_3$. During the epitaxial growth, the dopants previously implanted in the predetermined portion 313 of the NBL 310 (see FIG. 3C) are driven into the EPI layer 317, forming an N-type isolation region 316 therein. Structures, such as P-wells, N-wells, isolation rings, gate dielectric layers, gate structures, and source/drain contacts, are constructed on the EPI layer 317 to yield a semiconductor structure having a cross section 322 as shown in FIG. 3E.

FIG. 3E illustrates a cross section 322 of a symmetric LDPMOS transistor with a high voltage isolation structure constructed in accordance with the embodiment of the present invention. As explained in FIGS. 3A-3D, the NBL 310 is formed above the P-type substrate 312 while the EPI layers 318 and 320 are formed on top of the NBL 310 with the isolation region 316 dividing the EPI layer 317 (see FIG. 3D) into two EPI layers 318 and 320. The isolation region 316 and the EPI layers 318 and 320 are substantially of the same thickness. A P-well 324 is formed on the EPI layer 318 and substantially in alignment with the same. A P-well 326 is also formed on the EPI layer 320 and substantially in alignment with the same. An N-well 328 is formed between the P-wells 324 and 326 and on the isolation region 316, such that the isolation region 316 interfaces with its overlying N-well 328 and its underlying NBL 310. In this embodiment, the N-well 328 and the isolation region 316 are substantially in alignment.

A drain of the transistor (not shown in the figure) is connected to a P+ contact 330 for providing an ohmic contact connection. A source of the transistor (not shown in the figure) is connected to another P+ contact 332 for providing an ohmic contact connection. An isolation ring 334 is formed on the NBL 310 at the edge of the semiconductor structure as shown in the cross section 322, so that it is connected vertically with the NBL 310 and surrounds the P-wells 324 and 326 and the EPI layers 318 and 320. A gate oxide 336 is formed on the N-well 328, and partially on the P-wells 324 and 326. A gate structure 337 is formed on the surface of the gate oxide 336. To further protect the PMOS transistor as shown in the cross section 322, the surface is selectively covered by oxides 338.

With the isolation region 316 implemented between the two EPI layers 318 and 320, the leakage current problem is solved since there is no longer a leakage path for the current to flow between the P-wells 324 and 326. Meanwhile, the two EPI layers 318 and 320 have a sufficient thickness to prevent a punch-through between the P-wells 324 and 326 and the substrate 312. This LDPMOS transistor shown in the cross section 322 is suitable for operating in high voltages. For example, in order for the transistor to withstand a high operating voltage, such as a voltage over 40 volts, the thickness of the EPI layer 318 and 320 should be no less than about 5 µm.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A laterally-diffused MOS (LDMOS) transistor with a high voltage isolation structure, comprising:
   an N-type buried layer (NBL) formed on a semiconductor substrate;
   an isolation ring formed on the NBL;
   an EPI layer formed on the NBL and surrounded by the isolation ring, the EPI layer further comprises:
   a first P-type epitaxial region and a second P-type epitaxial region, both formed on the NBL; and
   an N-type epitaxial region formed between the first and second P-type epitaxial regions;
   a first P-well formed on the first P-type epitaxial region;
   a second P-well formed on the second P-type epitaxial region;
   an N-well formed on the N-type epitaxial region, wherein the N-type epitaxial region is in direct contact with the NBL and the N-well for preventing a leakage current from flowing between the first and second P-wells; and
   a gate dielectric layer formed on the N-well, and a gate structure atop the gate dielectric layer,
   wherein the EPI layer has a predetermined thickness for preventing a punch-through between the P-wells and the substrate.

2. The LDMOS transistor of claim 1 wherein the N-type epitaxial region and the N-well are substantially in alignment.

3. The LDMOS transistor of claim 1 wherein the N-type epitaxial region has an N-type dopant density of between about $1\times10^{17}$ cm$^{-3}$ and $2\times10^{18}$ cm$^{-3}$.

4. The LDMOS transistor of claim 1 wherein an epitaxial growth of the EPL layer is performed at a temperature ranging from 1000° C. and 1200° C.

5. The LDMOS transistor of claim 1 wherein the first and second P-type epitaxial regions are of substantially equal thickness, which is no less than about 5 µm.

6. The LDMOS transistor of claim 5 wherein the N-type epitaxial region is of substantially equal thickness to that of the first and second P-type epitaxial regions.

7. A laterally doped P-type metal-oxide-semiconductor (LDPMOS) transistor, comprising:
   an N-type buried layer (NBL) formed on a semiconductor substrate;
   an isolation ring formed on the NBL;
   an EPI layer formed on the NBL and surrounded by the isolation ring, the EPI layer further comprises:

a first P-type epitaxial region and a second P-type epitaxial region, both formed on the NBL; and an N-type epitaxial region formed between the first and second P-type epitaxial regions;

a first P-well formed on the first P-type epitaxial region;

a second P-well formed on the second P-type epitaxial region, wherein the N-type epitaxial region is in direct contact with the NBL and an N-well for preventing a leakage current from flowing between the first and second P-wells;

the N-well formed on the N-type epitaxial region, wherein the EPI layer has a predetermined thickness for preventing a punch-through between the P-wells and the substrate; and a gate dielectric layer formed on the N-well, and a gate structure atop the gate dielectric layer.

8. The LDPMOS transistor of claim 7 wherein the N-type epitaxial region and the N-well are substantially in alignment.

9. The LDPMOS transistor of claim 7 wherein the first and second P-type epitaxial regions are of substantially equal thickness, which is no less than about 5μm.

10. The LDPMOS transistor of claim 7 wherein the N-type epitaxial region has an N-type dopant density between about $1 \times 10^{17}$ cm$^{-3}$ and $2 \times 10^{18}$ cm$^{-3}$.

11. The LDPMOS transistor of claim 7 wherein an epitaxial growth of the EPL layer is performed at a temperature ranging from 1000° C. and 1200° C.

* * * * *